(12) United States Patent
Boyd et al.

(10) Patent No.: US 7,247,569 B2
(45) Date of Patent: Jul. 24, 2007

(54) ULTRA-THIN SI MOSFET DEVICE STRUCTURE AND METHOD OF MANUFACTURE

(75) Inventors: Diane C. Boyd, LaGrangeville, NY (US); Bruce B. Doris, Brewster, NY (US); Meikei Ieong, Wappingers Falls, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 162 days.

(21) Appl. No.: 10/725,848

(22) Filed: Dec. 2, 2003

(65) Prior Publication Data

US 2005/0118826 A1   Jun. 2, 2005

(51) Int. Cl.
*H01L 21/302*   (2006.01)
(52) U.S. Cl. ............... 438/699; 438/446; 438/282; 438/298; 257/347; 257/349; 257/524
(58) Field of Classification Search ................ 438/699, 438/723
See application file for complete search history.

(56) References Cited

U.S. PATENT DOCUMENTS

| | | | | |
|---|---|---|---|---|
| 4,748,134 A | * | 5/1988 | Holland et al. | 438/440 |
| 5,360,995 A | * | 11/1994 | Graas | 257/751 |
| 5,468,657 A | * | 11/1995 | Hsu | 438/766 |
| 6,001,706 A | * | 12/1999 | Tan et al. | 438/424 |
| 6,010,921 A | * | 1/2000 | Soutome | 438/151 |
| 6,022,768 A | * | 2/2000 | Peidous | 438/197 |
| 6,064,092 A | * | 5/2000 | Park | 257/347 |
| 6,110,779 A | * | 8/2000 | Yang et al. | 438/257 |
| 6,162,677 A | * | 12/2000 | Miyakawa et al. | 438/253 |
| 6,300,218 B1 | * | 10/2001 | Cohen et al. | 438/423 |
| 6,417,078 B1 | * | 7/2002 | Dolan et al. | 438/480 |
| 6,465,290 B1 | * | 10/2002 | Suguro et al. | 438/183 |
| 6,479,866 B1 | * | 11/2002 | Xiang | 257/347 |
| 6,486,037 B2 | * | 11/2002 | Norcott et al. | 438/406 |
| 6,531,741 B1 | * | 3/2003 | Hargrove et al. | 257/350 |
| 6,673,695 B1 | * | 1/2004 | Lim et al. | 438/424 |
| 2002/0153587 A1 | * | 10/2002 | Adkisson et al. | 257/510 |
| 2003/0186511 A1 | * | 10/2003 | Yiu et al. | 438/400 |

\* cited by examiner

*Primary Examiner*—Nadine G. Norton
*Assistant Examiner*—Patricia A George
(74) *Attorney, Agent, or Firm*—Scully, Scott, Murphy & Presser, P.C.; Robert M. Trepp, Esq.

(57) ABSTRACT

The present invention comprises a method for forming an ultra-thin channel MOSFET and the ultra-thin channel MOSFET produced therefrom. Specifically, the method comprises providing an SOI substrate having a buried insulating layer underlying an SOI layer; forming a pad stack atop the SOI layer; forming a block mask having a channel via atop the pad stack; providing a localized oxide region in the SOI layer on top of the buried insulating layer thereby thinning a portion of the SOI layer, the localized oxide region being self-aligned with the channel via; forming a gate in the channel via; removing at least the block mask; and forming source/drain extensions in the SOI layer abutting the thinned portion of the SOI layer. Providing the localized oxide region further comprises implanting oxygen dopant through the channel via into a portion of the SOI layer; and annealing the dopant to create the localized oxide region.

26 Claims, 8 Drawing Sheets

ULTRA-THIN SI MOSFET DEVICE STRUCTURE AND METHOD OF MANUFACTURE

FIELD OF INVENTION

The present invention relates to semiconductor devices and methods of manufacture, and more particularly to a method for manufacturing an improved metal oxide semiconductor (MOS) transistor having an ultra-thin channel (on the order of about 50 nm or less).

BACKGROUND OF THE INVENTION

Field effect transistors (FETs) are the basic building block of today's integrated circuits (ICs). Such transistors can be formed in conventional bulk semiconductor substrates (such as silicon) or in the SOI layer of a silicon-on-insulator (SOI) substrate.

In order to be able to make ICs, such as memory, logic, and other devices, of higher integration density than currently feasible, one has to find ways to further downscale the dimensions of field effect transistors (FETs), such as metal-oxide-semiconductor field effect transistors (MOSFETs) and complementary metal oxide semiconductors (CMOS). Scaling achieves compactness and improves operating performance in devices by shrinking the overall dimensions and operating voltages of the device, while maintaining the device's electrical properties. Additionally, all dimensions of the device must be scaled simultaneously in order to optimize electrical performance of a device.

SOI devices having a channel thickness of about 50.0 nm or less are a promising option to further continue SOI CMOS device scaling. Thin channel devices (bulk or SOI) provide a sharper-sub-threshold slope (measure of the abruptness of the switching of the device), high mobility (because the device is operated at a lower effective field) and better short channel effect control.

A disadvantage of thin channel devices is that as the silicon-on-insulator (SOI) film is thinned the series resistance increases. Therefore, in order to overcome increasing series resistance of prior art thin channel devices, raised source/drain regions (RSD) must be utilized. Raised source/drain regions typically degrade manufacturing yield and also increase parasitic capacitance, which causes degradation in circuit performance. Additionally, raised source/drain regions are formed by an epitaxial growth process, which typically requires a clean surface having a substantial crystalline structure.

In some prior art thin Si-channel devices, source/drain extension regions are implanted prior to raised source/drain formation resulting in a number of disadvantageous effects. For example, p-type extension regions require a thick offset spacer to control dopant diffusion and disadvantageously result in a high resistance region formed underlying the thick offset spacer. Additionally, in some prior art thin channel devices, the extension implants are conducted prior to raised source/drain formation; therefore subjecting the extension implant dopants to the significant thermal budget of the raised source/drain process, which may result in unwanted dopant diffusion. Further, the incubation time is different for p-type and n-type doped Si leading to substantially different raised source/drain thickness for p-type and n-type doped regions.

In one prior art thin Si channel device, a wide disposable spacer is utilized to grow the raised source/drain regions. High-energy implants are performed to form deep source/drain regions. Following the high-energy implant, the wide disposable spacer is removed and extension regions are implanted. This prior art process overcomes excessive extension dopant diffusion and the epitaxial Si growth rate differential between p-type and n-type regions, but does not overcome the formation of high resistance regions outside the raised source/drain area, which are key to the performance of thin SOI MOSFETs. The formation of high resistance regions outside the raised source/drain area is also cost ineffective. In addition, the raised source drain regions cause increased parasitic capacitance, which slows down circuit performance.

Another prior art scheme utilizes a dummy structure as an implant mask for implanting oxygen ions into a bulk Si substrate. This process simultaneously creates a buried oxide layer and also forms a thin Si region; the thin Si region is produced by the dummy structure. However, in order to create a suitably thick buried oxide layer, a high-energy oxygen implant is needed. The large energy distribution of the high-energy implant required to form a suitably thick buried oxide layer disadvantageously results in a substantially wide region of thin Si that is much larger, in a lateral direction, than the desired width of the channel region. The lateral spread of the oxygen implant is proportional to the implant depth. Specifically, the lateral spread for oxygen implants conducted through gate structures into substrates utilized in conventional semiconducting devices is equal to ⅓ the depth of the peak oxygen implant in the vertical direction. The lateral spread is also affected by the implant energy, where the greater the implant energy the greater the lateral spread.

Referring to FIG. 1, when using the above prior art method in order to produce a low junction capacity SOI device in a bulk Si substrate 37, a buried oxide layer 36 having a vertical thickness $T_5$ of the order of 200.0 nm must be formed as well as an SOI layer 35 having a thickness $T_2$ on the order of about 70 nm. Taking into account the vertical spread of oxygen dopant, in order to form a thinned channel region 26 underlying the dummy gate region 18, while simultaneously forming a suitable buried oxide region 36, an oxygen implant peak must extend through the dummy gate 18 ($T_4$=70.0 nm), through the desired thickness of the thin channel 26 ($T_1$=20.0 nm), and extend to a depth equal to half the thickness of the desired buried oxide 36 thickness ($T_3$=½(200.0 nm)). In the present example, the required peak implant depth to produce a suitable buried oxide layer 36 is equal to:

$$20.0 \text{ nm} + 70.0 \text{ nm} + \tfrac{1}{2}(200.0 \text{ nm}) = 190.0 \text{ nm}$$

As stated previously, the lateral spread of oxygen dopant $W_1$ is equivalent to ⅓ the depth (vertical thickness) of the peak oxygen implant. Therefore, in the present example of the prior art, the lateral spread of the oxygen dopant is on the order of about 60.0 nm. The lateral spread results in a channel region 26 that is not aligned with the edges of the overlying gate region 18, therefore producing thin silicon high resistance regions 40 at the terminal ends of the channel region 26 of the device. Additionally, the high-energy implant can produce defects and high levels of metallic contamination.

In view of the state of the art mentioned above, it would be highly desirable to provide an ultra-thin channel silicon-on-insulator device that overcomes the above-described disadvantages. More specifically, it would be highly desirable to provide ultra-thin channel silicon-on-insulator devices having low external resistance without raised source/drain regions. It would also be advantageous to provide ultra-thin channel devices with lower parasitic capacitance.

SUMMARY OF THE INVENTION

The present invention provides a method for forming an ultra-thin channel SOI device having a low external resistance, in which the channel region that is located in the SOI layer of a SOI substrate is effectively thinned by an underlying localized oxide region. In accordance with the present invention, the localized oxide region is self-aligned to an overlying gate region. Specifically, the present method forms a localized oxide region positioned on, and in contact with a buried insulating layer of a silicon-on-insulator (SOI) substrate producing a thinned channel region atop the localized oxide region that is self-aligned to an overlying gate region.

The localized oxide region is produced by implanting oxygen through a channel via, i.e., opening, which is formed in a patterned block mask and then annealing to convert the implanted region into a localized oxide region. The localized oxide region forms atop the buried insulating layer thereby effectively thinning portions of the SOI layer. Because of the presence of the dielectric block mask, the oxygen implant occurs only through the channel via; no oxygen ions are implanted through the dielectric block mask itself due to either its thickness or material.

Thinning the channel region with a localized oxide region allows for source/drain regions formed in the SOI layer to have a thickness sufficient to provide a low external resistance device. External resistance is the total resistance of the device outside the channel region. The present invention provides a low external resistance device having a resistance value less than about 400.0 Ohm/µm, with 200.0 Ohm/µm being preferred. Therefore, the present invention provides a low external resistance ultra-thin channel SOI device without requiring raised source/drain regions.

In broad terms, the inventive method comprises:

providing a SOI substrate having an SOI layer located on a buried insulating layer;

forming a block mask having a channel via atop the SOI substrate;

providing a localized oxide region in the SOI layer on top of the buried insulating layer thereby forming a thinned portion of the SOI layer, the localized oxide region being self-aligned with the channel via;

forming a gate in the channel via;

removing at least the block mask; and forming source/drain extensions in the SOI layer abutting the thinned portion of the SOI layer.

In accordance with the present invention, the localized oxide region is formed by implanting oxygen through the channel via to create a dopant profile within the SOI layer, and then annealing using conditions that are effective in converting the dopant profile into a localized oxide region. Forming the patterned block mask having a channel via begins with forming a dummy gate region atop the pad stack. A masking layer, e.g., a dielectric and/or resist, is then deposited and planarized to be substantially coplanar with a top surface of the dummy gate region. The dummy gate region is then removed using a selective etch process to produce the channel via.

Another aspect of the present invention relates to an ultra-thin channel MOSFET produced by the above method. In broad terms, the ultra-thin channel MOSFET comprises:

an SOI substrate comprising an SOI layer overlying a buried insulating layer, said SOI layer having a lesser thickness portion and a greater thickness portion;

a gate region atop said SOI layer having composite spacers;

source and drain extension regions within said greater thickness portion of said SOI layer;

a channel self-aligned to said gate region and separating said source and drain extension regions, said channel located in said lesser thickness region of said SOI layer; and a localized oxide region atop said buried insulating layer and underlying said channel region.

The lesser thickness portion of the SOI layer has a thickness less than about 50.0 nm and the greater thickness portion has a thickness ranging from about 150.0 nm to about 200.0 nm.

DETAILED DESCRIPTION

Figure 1:
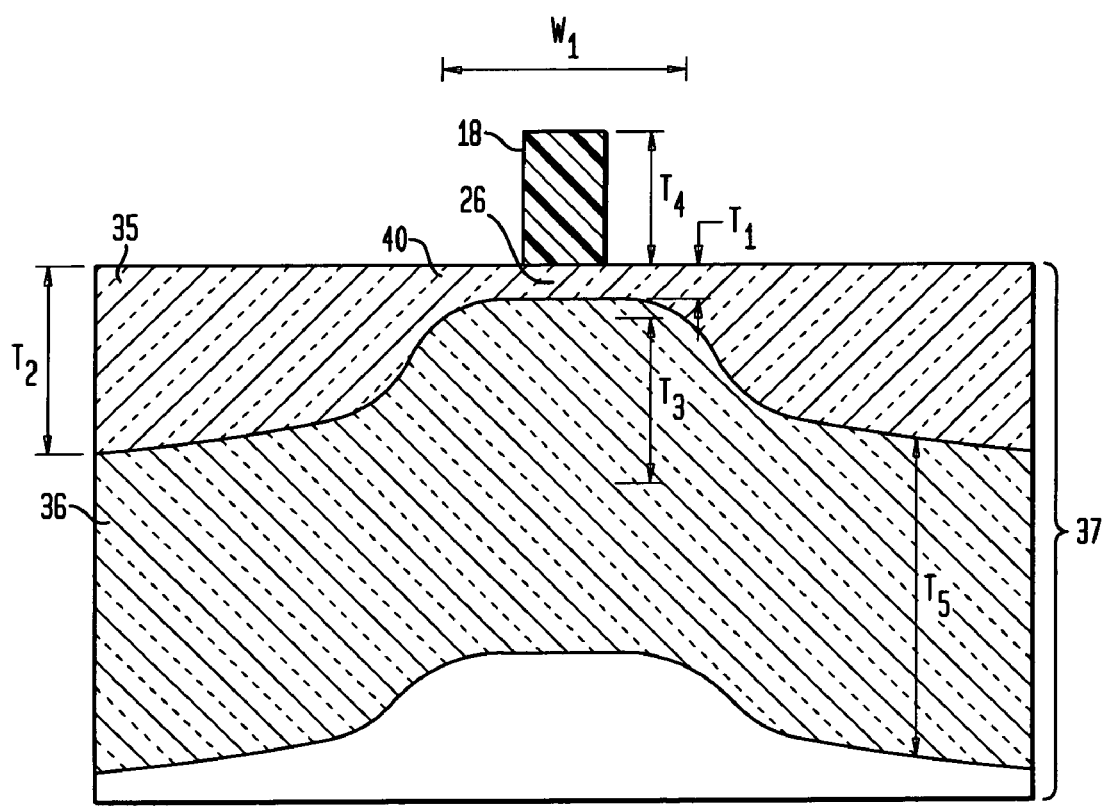
FIG. 1 is a pictorial representation (through a cross section view) of a prior art device, where a channel region is thinned during the formation of a buried oxide layer within a bulk Si substrate.

The present invention provides a method for forming an ultra-thin channel MOSFET having low resistance source/ drain regions 24 formed in the SOI layer 14 of a silicon-on-insulator (SOI) substrate 9. The thickness $T_1$ of the thin channel region 26 of the present invention is on the order of less than about 50.0 nm, preferably ranging from approximately 3.0 nm to approximately 30.0 nm.

The thin channel MOSFET produced by the inventive method further comprises a localized oxide region 25 self-aligned to an overlying gate region 23, where the localized oxide region 25 in conjunction with the buried insulating layer 13 of the SOI substrate 10 effectively thin the device channel 26. In addition to thinning the device channel, the localized oxide region 25 allows for the formation of source/drain extensions 24 within the SOI layer 14 having a thickness $T_2$ sufficient to produce a low external resistance device. The present invention will now be described in more detail referring to the drawings that accompany the present application.

Figure 2:
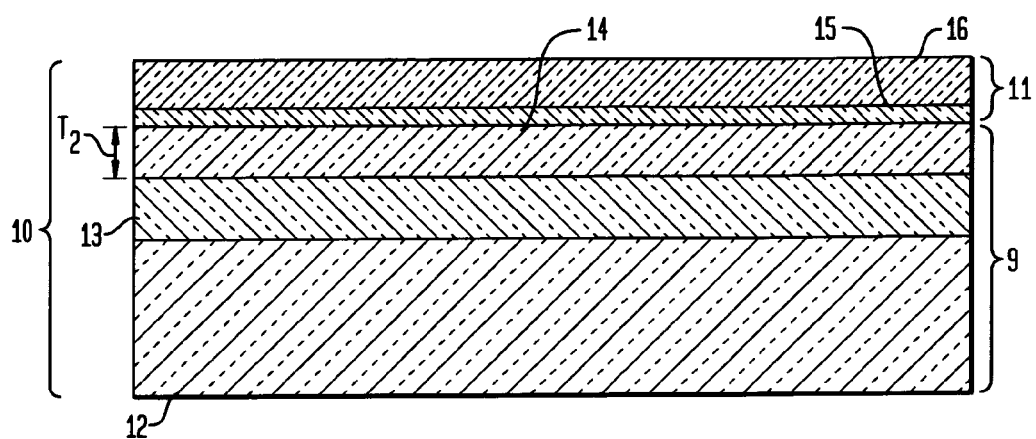
FIG. 2 is a pictorial representation (through a cross section view) of the initial structure of the present invention.

Reference is first made to FIG. 2, which illustrates an initial structure 10 that can be employed in the present invention including a pad stack 11 atop an SOI substrate 9. Specifically, the SOI substrate 9 comprises bottom Si-containing layer 12, buried insulating layer 13 present atop bottom Si-containing layer 12, and top Si-containing layer (i.e., SOI layer) 14 present atop the surface of the buried insulating layer 13.

The term "Si-containing layer" as used herein denotes any semiconductor material that includes silicon. Illustrative examples of various Si semiconductor materials that can be employed in the present invention include, but are not limited to: Si, SiGe, SiGeC, SiC and other like Si-containing materials. Combinations of the aforementioned semiconductor materials can also be used as the Si-containing layers of the SOI substrate. The top Si-containing layer (hereinafter referred to as the SOI layer) 14 may have a thickness $T_2$ ranging from approximately 20.0 nm to approximately 70.0 nm. The buried insulating layer 13 is typically a buried oxide region, which may have a thickness ranging from about 150.0 nm to about 200.0 nm. The thickness of the bulk Si-containing layer 12 is not critical to the present invention.

The SOI substrate 9 shown in FIG. 1 is fabricated using techniques well known to those skilled in the art. For example, the SOI substrate 9 may be formed by a thermal bonding process, or alternatively, the SOI structure 9 may be formed by an oxygen implantation process, which is referred to in the art as a separation by implantation of oxygen (SIMOX).

The pad stack 11 is then formed atop the SOI substrate 9 typically following conventional wafer cleaning processing steps, using techniques well known to those skilled in the art. The cleaning processing steps may include a cleaning mixture comprising ammonium hydroxide, hydrogen peroxide and deionized water or a cleaning mixture comprising hydrochloric acid, hydrogen peroxide, and deionized water.

Pad stack 11 may comprise pad oxide layer 15 and pad nitride layer 16. Pad oxide layer 15 may be formed by thermal oxidation or a conventional deposition processes, such as, for example, chemical vapor deposition, room temperature chemical vapor deposition, plasma enhanced chemical vapor deposition, or chemical solution deposition. Pad oxide layer 15 may have a thickness ranging from about 2.0 nm to about 10.0 nm. Following pad oxide layer 15 formation, pad nitride layer 16 may be formed using conventional deposition processes, including but not limited to: chemical vapor deposition, room temperature chemical vapor deposition, or plasma enhanced chemical vapor deposition. The pad nitride layer 16 may comprise a conventional nitride, such as $Si_3N_4$, and may have a thickness ranging from about 50.0 nm to about 150.0 nm.

Although illustration is provided for a pad stack that has two layers, the present invention works in cases wherein pad stack 11 comprises a single layer or more than two layers.

Figure 3:
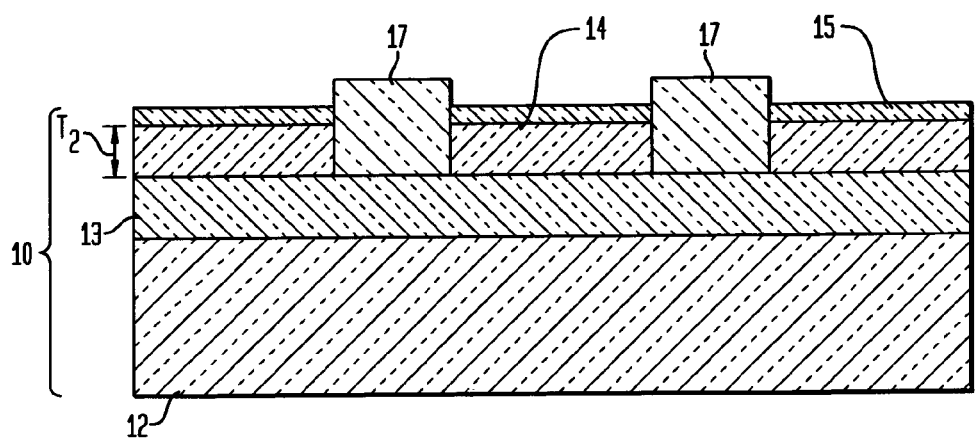
FIG. 3 is a pictorial representation (through a cross sectional view) of the structure of FIG. 2 further including isolation regions.

Referring now to FIG. 3, isolation regions 17 are then formed in the initial structure 10. Isolation regions 17 may be shallow trench isolation (STI) regions formed by etching a trench through the pad nitride layer 16, pad oxide layer 15 and SOI layer 14 to contact the buried insulating layer 13. The etching step may be performed utilizing a conventional dry etching process such as reactive-ion etching, ion beam etching, laser ablation or any combination thereof. A single etching process may be employed, or alternatively, more than one etching process may be employed to form trenches in the SOI structure.

The trenches may optionally be lined with a conventional liner material, e.g., $SiO_2$ or $Si_3N_4$, using thermal oxidation or nitridation. The optional liner may have a thickness of less than about 10.0 nm. CVD or another like deposition process can be used to fill the trench with an STI dielectric material such as a high-density plasma (HDP) oxide or TEOS (tetraethylorthosilicate).

The STI dielectric may optionally be densified after deposition. Following, densification the STI dielectric may be recessed using an HF wet etch. Alternatively, a conventional planarization process such as chemical-mechanical polishing (CMP) or grinding may optionally be used to provide a planar structure.

The isolation region 17 may alternatively be formed by local oxidation (LOCOS) or by an oxide mesa formation process both of which are well know to those skilled in the art.

The pad nitride layer 16 is then typically removed using a hot phosphoric etch process. The nitride layer 16 may alternatively be removed using another conventional etch process in which the etch chemistry is selective to oxide pad layer 15.

Figure 4:
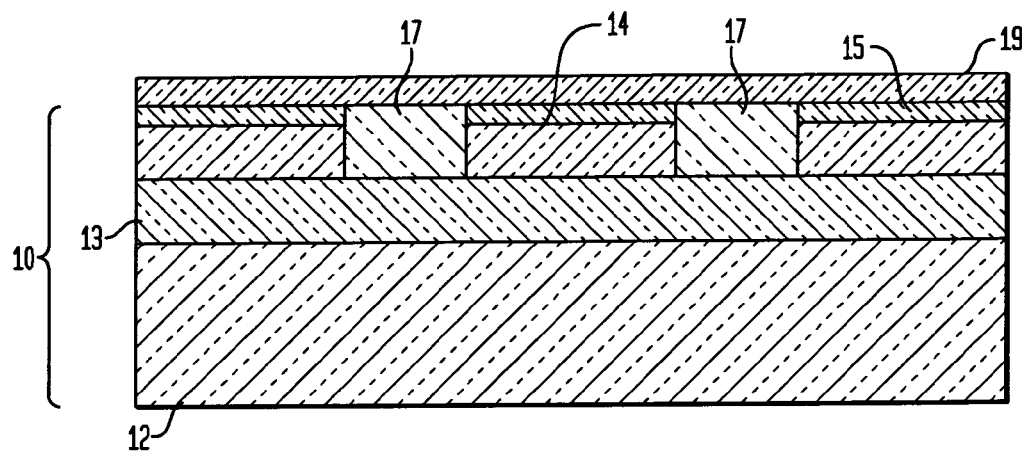
FIG. 4 is a pictorial representation (through a cross sectional view) depicting FIG. 3 further including an etch stop layer.

In a next process step, depicted in FIG. 4, an etch stop layer 19 is formed atop pad oxide layer 15. In a preferred embodiment of the present invention, etch stop layer 19 may be a nitride or oxynitrides, with $Si_3N_4$ being highly preferred. The etch stop layer 19 can be deposited using conventional deposition process including, but not limited to: chemical vapor deposition, room temperature chemical vapor deposition, or plasma enhanced chemical vapor deposition. The thickness of the etch stop layer may range from about 50.0 nm to about 150.0 nm.

Figure 5:
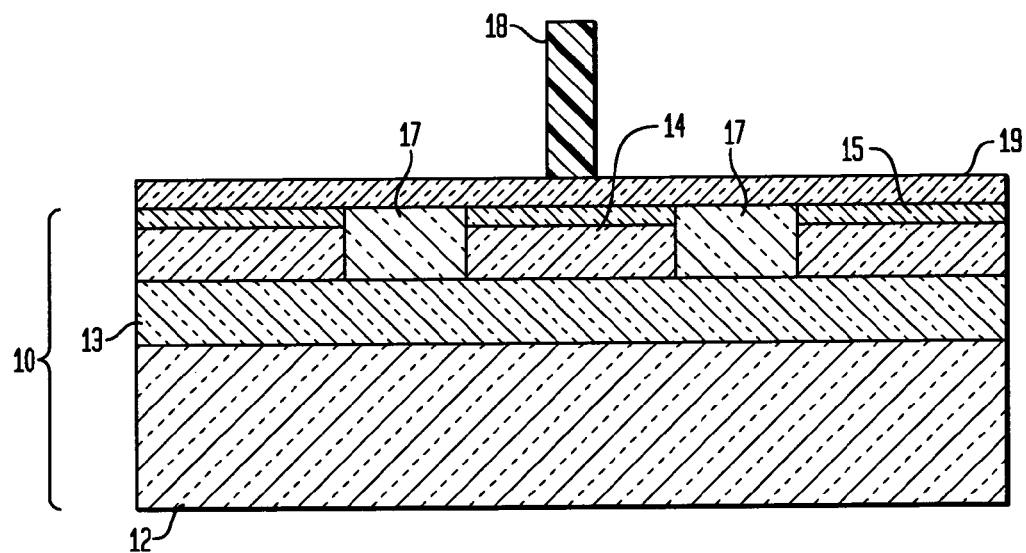
FIG. 5 is a pictorial representation (through a cross sectional view) of the structure of FIG. 4, further including a dummy gate region.

Now referring to FIG. 5, a dummy gate region 18 is formed atop the etch stop layer 19. The dummy gate region 18 is formed by first blanket depositing a layer of dummy gate material using a conventional deposition process, including but not limited to: low pressure chemical vapor deposition or room temperature chemical vapor deposition. The dummy gate material may include polysilicon or another like material and can have a thickness ranging from approximately 80.0 nm to approximately 200.0 nm.

The dummy gate region 18 is then formed from the deposited layer of dummy gate material using conventional photolithography and etching. More specifically, a pattern is produced by applying a photoresist to the surface to be etched; exposing the photoresist to a pattern of radiation; and then developing the pattern into the photoresist utilizing a conventional resist developer. Once the patterning of the photoresist is completed, the sections covered by the photoresist are protected while the exposed regions are removed using a selective etching process that removes the unprotected regions.

In one embodiment of the present invention, a gate stack etching process utilizing HBr etch chemistries is used to etch the unprotected portions of the dummy gate material selective to the underlying etch stop layer 19. The patterned resist is then removed using an $O_2$ ash process. Alternatively, the patterned resist may be stripped using a wet chemical process. The resultant dummy gate region 18 is depicted in FIG. 5.

Despite showing the presence of a single dummy gate region, the present invention also contemplates forming a plurality of such dummy gate regions across the entire structure.

Figure 6:
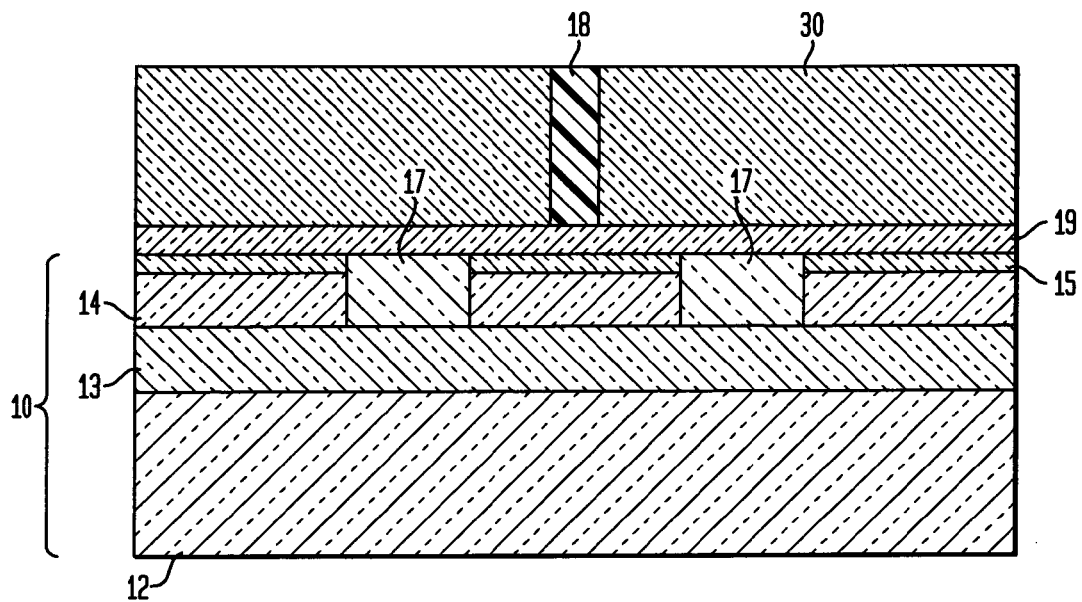
FIG. 6 is a pictorial representation (through a cross sectional view) of the structure shown in FIG. 5 further including a block mask.

Turning to FIG. 6, a masking layer 30, such as a dielectric material or a resist, preferably a high-density plasma oxide, is deposited atop the entire substrate and planarized by chemical mechanical polishing (CMP) or like process until the top surface of the dummy gate region 18 is exposed.

Figure 7:
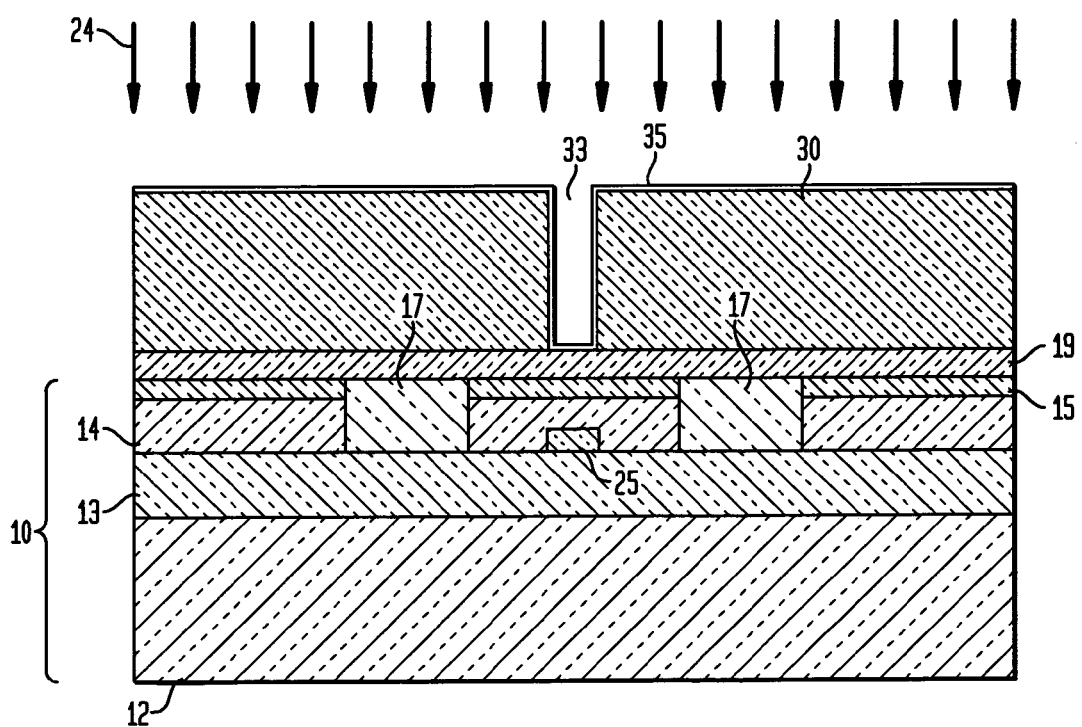
FIG. 7 is a pictorial representation (through a cross sectional view) of the structure shown in FIG. 6, following the deposition of a conformal film and oxygen implantation.

Referring to FIG. 7, dummy gate region 18 is then removed using a wet or dry etch process, which is selective to the planarized masking layer 30 and etch stop layer 19. Preferably, a polysilicon dummy gate region 18 is removed using bromide gas etch chemistries, i.e., HBr, having a high selectivity to the etch stop layer 19. Removing dummy gate region 18 produces a channel via 33.

A conformal film 35, preferably nitride, is then deposited atop the masking layer 30 and within the channel via 33 using conventional deposition processes, including but not limited to: chemical vapor deposition, low pressure chemical vapor deposition, and plasma enhanced deposition. Alternatively, the conformal film 35 may be grown using thermal nitridation. The thickness of the conformal film 35 is typical from about 5.0 nm to about 60.0 nm.

Still referring to FIG. 7, in a next process step, oxygen 24 is implanted into the SOI layer 14 through channel via 33. By implanting oxygen through the channel via 33 and utilizing the masking layer 30 as a block mask, the oxygen implant is only introduced into a region of the SOI layer 14 that is self-aligned to the edges of the channel via 33. The positioning of the oxygen dopant profile 25 is a function of channel via 33 width, implant energy, and implant dosage. The thickness of the etch stop layer 19, exposed by the channel via 33, also contributes to the positioning of the oxygen dopant profile 25. By adjusting the implant energy, oxygen implant dosage, channel via 33 width and thickness of the etch stop layer 19, the positioning of the oxygen profile may be tailored to produce a thinned channel region 26 self-aligned to a overlying gate 31, to be subsequently formed.

Figure 8:
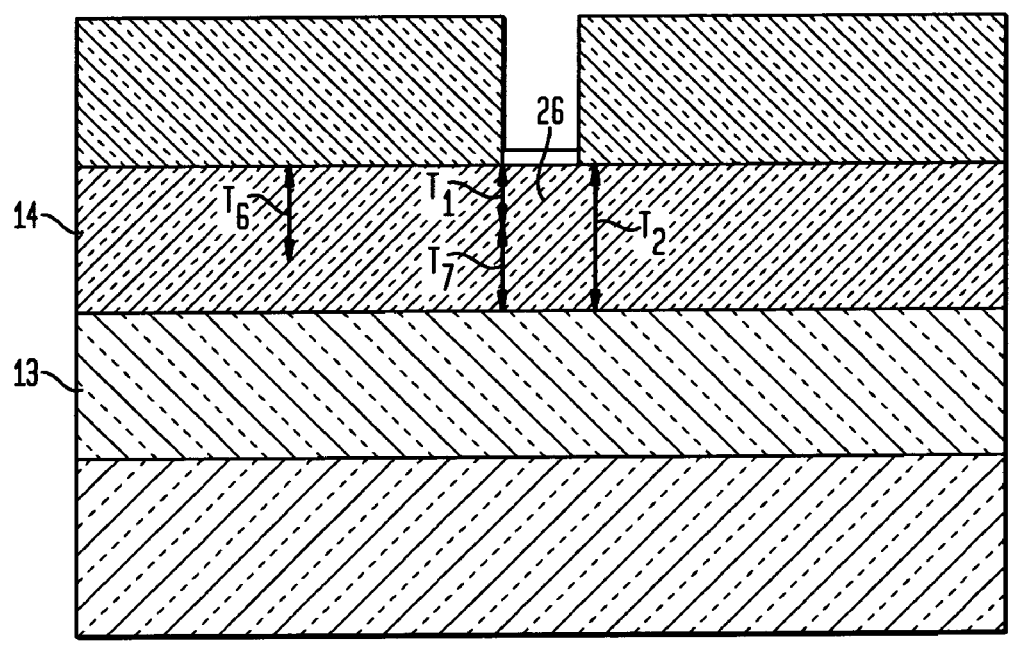
FIG. 8 is a pictorial representation (through a cross sectional view) of the oxygen dopant implant profile of the present invention.

In one example, depicted in FIG. 8, in order to provide a thinned channel region 26 in a SOI layer 14 having a thickness $T_2$, on the order of about 70.0 nm, oxygen dopants are implanted into the substrate, where the peak of the implant $T_6$ is about 45.0 nm from the SOI layer 14 surface. The oxygen dopants produce a 50.0 nm thick oxygen dopant profile $T_7$ that contacts the buried oxide layer 13 and effectively thins the channel region to approximately 20.0 nm.

In this example, the required implant depth is equal to the desired channel thickness ($T_2$) plus the desired thickness of the oxide dopant region, taking into account the vertical spread of the dopant implant. More specifically, the implant peak must extend beyond the desired channel thickness ($T_2$=20.0 m) plus approximately half the desired thickness of the oxide dopant region ($T_7$=(½(50.0 nm)). In this example, the implant peak depth $T_6$ is equal to 45.0 nm, as exemplified below:

$$20.0 \text{ nm} + \frac{1}{2}(50.0 \text{ nm}) = 45.0 \text{ nm}$$

The vertical spread of the implanted dopant forms an oxygen dopant profile that contacts the buried oxide layer 13, while effectively thinning the channel region 26.

The lateral spread of the oxide dopant is about ⅓ the depth of the implant peak. Therefore, in the present example the lateral spread of the oxygen dopant is limited to approximately 15.0 nm. The limited lateral spread of the oxygen dopant reduces the amount of thin Si outside the channel region of the device; decreasing the production of high resistance regions existing at the terminal ends of the channel region, as formed in prior art methods. Compared to thin channel MOSFETs formed using conventional methods, having an oxygen dopant lateral spread greater than 60 nm, the present invention increases MOSFET drive current by approximately 30% to 50%. Therefore, the inventive method significantly increases drive current and device performance. Additionally, by limiting the lateral spread of the oxygen dopant, a thin channel 26 is provided having edges substantially self-aligned to the edges of the subsequently formed overlying gate.

The present invention should not be limited to the dimensions discussed in the above example, since the above example was included for illustrative purposes only.

Following an annealing step, the oxygen implant forms a localized oxide region 25 extending from the buried insulator layer 13 that thins the region of the SOI layer 14 aligned with the channel via 33. Therefore, since a functioning gate 31 is later formed in the channel via 33, the localized oxide region 25 forms a thin channel region 26 self-aligned to a functioning gate region 31.

In addition, thinning the channel region 26 with a localized oxide region 25 extending from the buried layer 13 allows for source/drain extension regions 24 to be formed in regions of the SOI layer 14 having a thickness sufficient to provide a low external resistance contact. The thick portions of the SOI layer may be on the order of approximately 20.0 nm to approximately 70.0 nm. Therefore, the present invention does not require raised source/drain regions to produce a low resistance contact. The implant process is now discussed in greater detail.

The oxygen implant may comprise a base implant having an ion dosage of about $4 \times 10^{16}$ atoms/cm$^2$ or greater, with an ion dosage from about $2 \times 10^{17}$ atoms/cm$^2$ to about $2 \times 10^{18}$ atoms/cm$^2$ being more preferred. Oxygen implant is typically carried out in an ion implant apparatus that operates at a beam current density from about 0.05 mA cm$^{-2}$ to about 500.0 mA cm$^{-2}$ and at an energy from about 5.0 keV to about 60.0 keV. More preferably, this implant is carried out using an energy of from about 10.0 keV to about 30.0 keV and a beam current density from about 5.0 mA cm$^{-2}$ to about 10.0 mA cm$^{-2}$. This base implant is carried out at a temperature from about 200° C. to about 800° C. with a temperature from about 200° C. to about 600° C. being more highly preferred.

The oxygen implant may further comprise a room temperature or second implant. The term "room temperature implant" as used herein for this embodiment of the present invention denotes an ion dose of about $1 \times 10^{14}$ atoms/cm$^2$ to about $1 \times 10^{16}$ atoms/cm$^2$, with an ion dose from about $1 \times 10^{15}$ atoms/cm$^2$ to about $4 \times 10^{15}$ atoms/cm$^2$ being more highly preferred. The second ion implant is carried out at an energy from about 2.0 keV or greater, with an energy from about 5.0 keV to about 45.0 keV being more preferred. This second implant is performed at a temperature from about 4K to about 200° C. with a beam current density from about 0.05 mA cm$^{-2}$ to about 10.0 mA cm$^{-2}$. More preferably, the second ion implant may be performed at a temperature of from about 25° C. to about 100° C. with a beam current density of from about 0.5 mA cm$^{-2}$ to about 5.0 mA cm$^{-2}$.

In a preferred embodiment, the oxygen forming dopant profile 25, after annealing, forms a localized oxide region 25 in the SOI layer 14, where the localized oxide region 25 extends from the underlying insulating layer 13 of the SOI substrate 9 in a manner that effectively thins the device channel region 26.

In one example, the above scenario may be achieved with a channel via 33 width ranging from about 10.0 nm to about 100.0 nm, preferably being 60.0 nm; an etch stop 19 thickness ranging from about 50.0 nm to about 150.0 nm, preferably being 80.0 nm; a SOI layer 14 thickness ranging from about 20.0 nm to about 100.0 nm, preferably being 70.0 nm; an oxygen dopant concentration ranging from about 8×10$^{16}$ atoms/cm$^2$ to about 3×10$^{17}$ atoms/cm$^2$; and a oxygen implant energy ranging from about 30.0 keV to about 60.0 keV.

Following implantation, the structure is next annealed for a sufficient time and temperature to form the localized oxidation region 25, where said localized oxidation region 25 is positioned in the SOI layer 14 contacting the underlying buried insulating layer 13 and is self-aligned to the overlying channel via 31. Specifically, the annealing step of the present invention is performed at a high temperature from about 900° C. to about 1350° C., with a temperature from about 1200° C. to about 1335° C. being more highly preferred. Moreover, the annealing step of the present invention is carried out in an oxidizing ambient that includes at least one oxygen-containing gas such as O$_2$, NO, N$_2$O, ozone, air and other like oxygen-containing gases. The oxygen-containing gas may be admixed with each other (such as an admixture of O$_2$ and NO), or the gas may be diluted with an inert gas such as He, Ar, N$_2$, Xe, Kr, or Ne.

The annealing step may be carried out for a variable period of time that typically ranges from about 10 to about 1800 minutes, with a time period from about 60 to about 600 minutes being more highly preferred. The annealing step may be carried out at a single targeted temperature, or various ramp and soak cycles using various ramp rates and soak times can be employed.

During the annealing, the implant oxygen profile is converted to an oxide that may comprise a thermal oxide and an implant oxide. In regions underlying the channel via, the oxide forms a localized oxide layer that effectively thins portions of the overlying SOI layer. In regions outside the channel via, no oxide is formed since the patterned block mask has either a sufficient thickness to prevent oxygen from being implanted into the SOI substrate or is composed of a material that prevents oxygen from being implanted into the SOI substrate. The localized buried oxide is formed on top of and in contact with the buried insulating layer. As such, the insulating material, i.e., buried insulating and local oxide region, underneath the channel via is thicker than the insulating material not underneath the channel via.

Figure 9:
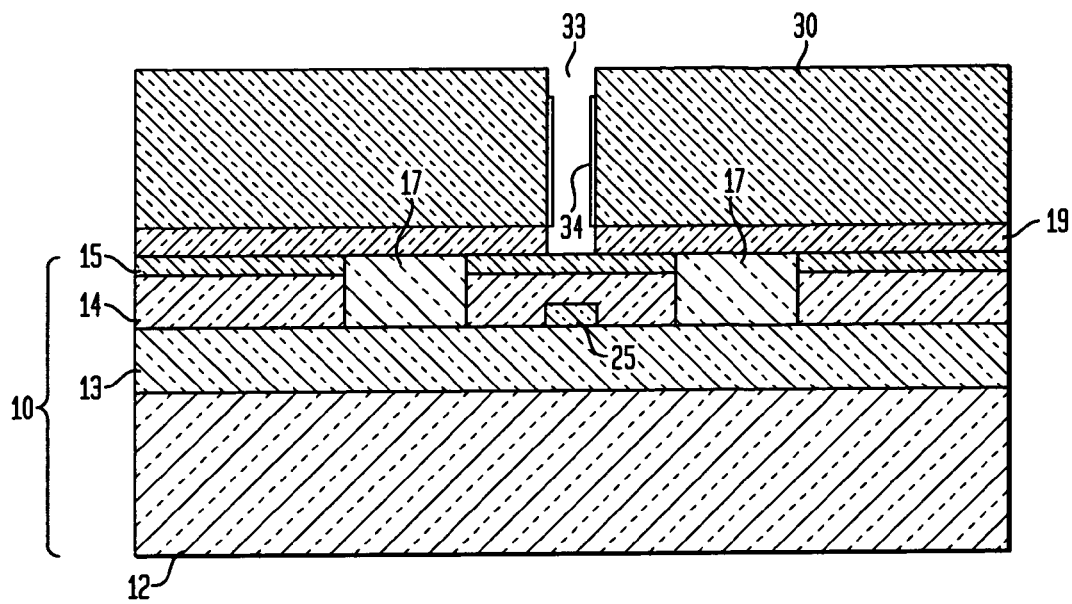
FIG. 9 is a pictorial representation (through a cross sectional view) of the structure shown in FIG. 7 following selective etch process steps to remove the dummy gate.

Referring to FIG. 9, horizontal surfaces of the conformal film 35 and the etch stop layer 19 exposed by the channel via 33 are then etched using an anisotropic dry etch selective to the pad oxide 15 and the patterned block mask 30. In one embodiment, the conformal film 35 and the etch stop layer 19 may be removed from the horizontal surfaces of the pad oxide 15 and patterned block mask 30 using a conventional nitride spacer etch. The conformal film 35 formed on the vertical surfaces of the channel via 33 is slightly recessed at the upper region of the via channel 33, where the majority of the conformal film 35 on the vertical surface of the channel via 33 remains producing spacers 34. The spacers 34 are preferably nitride material such as Si$_3$N$_4$. Following the removal of the etch stop 19 within the channel via 33, a portion of the pad oxide layer 15 is exposed.

Figure 10:
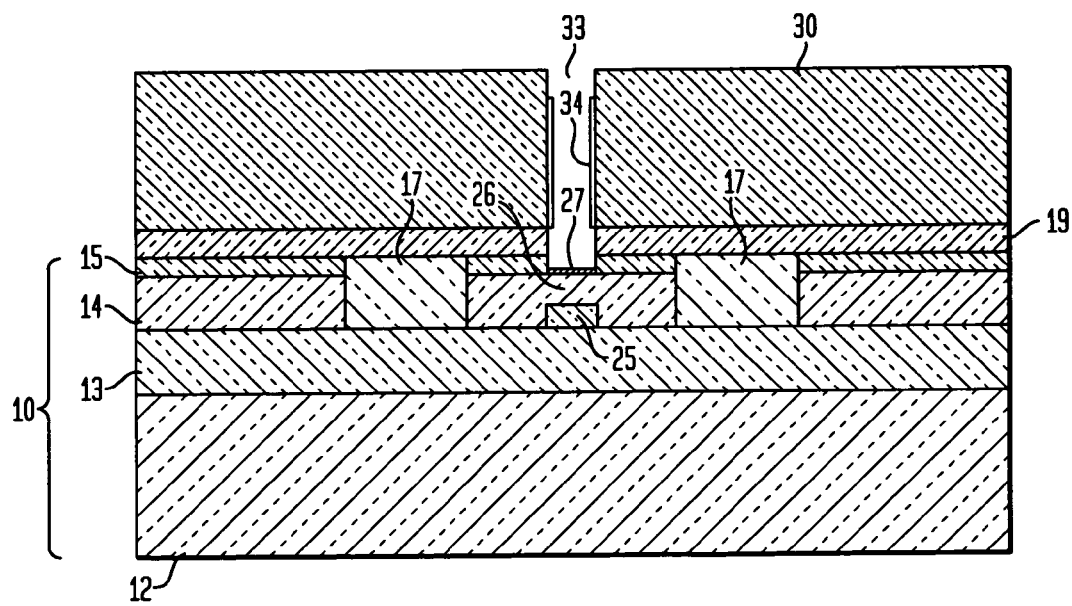
FIG. 10 is a pictorial representation (through a cross sectional view) of the structure shown in FIG. 9, further including the formation of a gate dielectric.

Turning to FIG. 10, a pre-clean surface preparation follows the removal of the etch stop layer 19 within the channel via 33. The pre-clean surface prep may include a chemical oxide removal (COR) process that is carried out at relatively low pressures (6 milli-torr or less) in a vapor of HF and NH$_3$ and removes a portion of the pad oxide layer 15 without damaging the underlying channel region 26. Alternatively, the pad oxide layer 15 may be removed using dry etch processes, including but not limited to: reactive ion etch and high-density plasma etch. In order to ensure that the pad oxide layer 15 is removed without damaging the underlying SOI layer 14, the etch process may be timed or monitored using end point detection methods. A wet pre-clean consisting of a NH$_4$OH, H$_2$O$_2$ and H$_2$O mixture followed by another wet cleaning step consisting of HCL, H$_2$O$_2$ and H$_2$O and a final HF dip may also be done.

Next, gate dielectric 27 is formed atop the thinned device channel region 26 by a thermal oxidation, nitridation or oxynitridation process. Alternatively, gate dielectric 27 may be formed utilizing a conventional deposition process. Combinations of the aforementioned processes may also be used in forming the gate dielectric 27. The gate dielectric 27 may be composed of any conventional dielectric including, but not limited to: SiO$_2$; Si$_3$N$_4$; SiON; temperature sensitive high-k dielectrics such as TiO$_2$, Al$_2$O$_3$, ZrO$_2$, HfO$_2$, Ta$_2$O$_5$, La$_2$O$_3$; and other like oxides including perovskite-type oxides. Gate dielectric 27 may also comprise any combination of the aforementioned dielectric materials. The gate dielectric 27 preferably has a thickness ranging from about 2.5 nm to about 5.0 nm.

Figure 11:
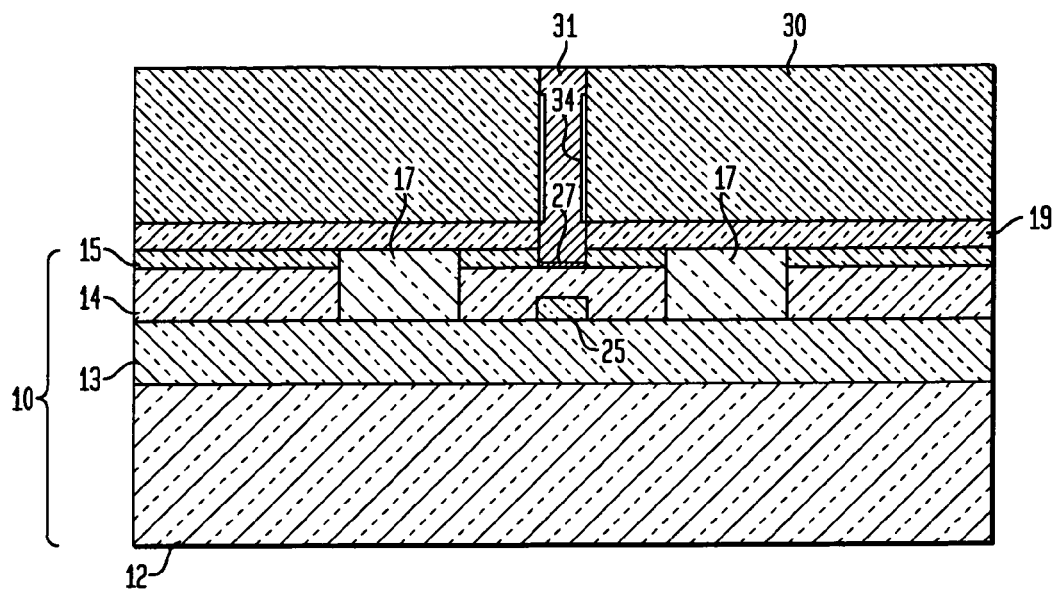
FIG. 11 is a pictorial representation (through cross sectional view) of the structure shown in FIG. 10 further comprising a gate conductor material deposited in the channel via atop the gate dielectric.

After gate dielectric 27 has been formed, gate conductor 31 is formed atop gate dielectric 27 by a conventional deposition process (such as CVD, plasma-assisted CVD, plating, sputtering and etc.) followed by planarization. Gate conductor 31 may comprise any conductive material including but not limited to: polysilicon; a conductive elemental metal such as W, Cu, Pt, Ag, Au, Ru, Ir, Rh, and Re; alloys that include at least one of the aforementioned conductive elemental metals; silicides or nitrides that include at least one of the above-mentioned conductive elemental metals; and combinations thereof may be employed. When a combination of conductive elements is employed, an optional diffusion barrier material such as TaN or WN may be formed between the conductive materials. The resultant structure that is formed after gate dielectric 27 and gate conductor 31 have been formed is shown, for example, in FIG. 11.

A highly preferred conductive material employed as gate conductor 31 is polysilicon since polysilicon gate conductor's lead to a fully-depleted MOSFET structure with a very low off-current. When a polysilicon gate conductor is employed, the polysilicon gate conductor is formed by deposition, planarization, ion implantation and annealing. The annealing conditions used at this point of the present invention in forming the poly-Si gate conductor may vary. Exemplary annealing conditions that may be employed in the present invention include: 1050° C. for 5 seconds.

One aspect of the present invention is that the gate conductor 31 may be independently implanted separately from the source/drain regions 24, where the block mask 30 protects the underlying SOI substrate 9 from being doped during gate conductor implantation. In one embodiment of the present invention, the gate conductor 31 is a mid gap metal.

Figure 12:
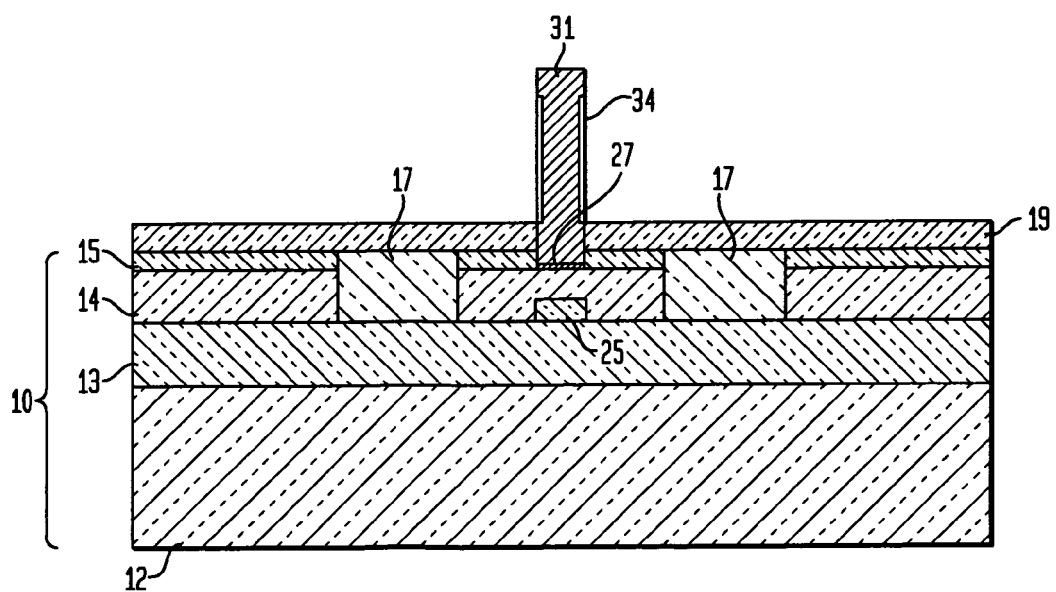
FIG. 12 is a pictorial representation (through cross sectional view) of the structure shown in FIG. 11 following block mask removal.
Figure 13:
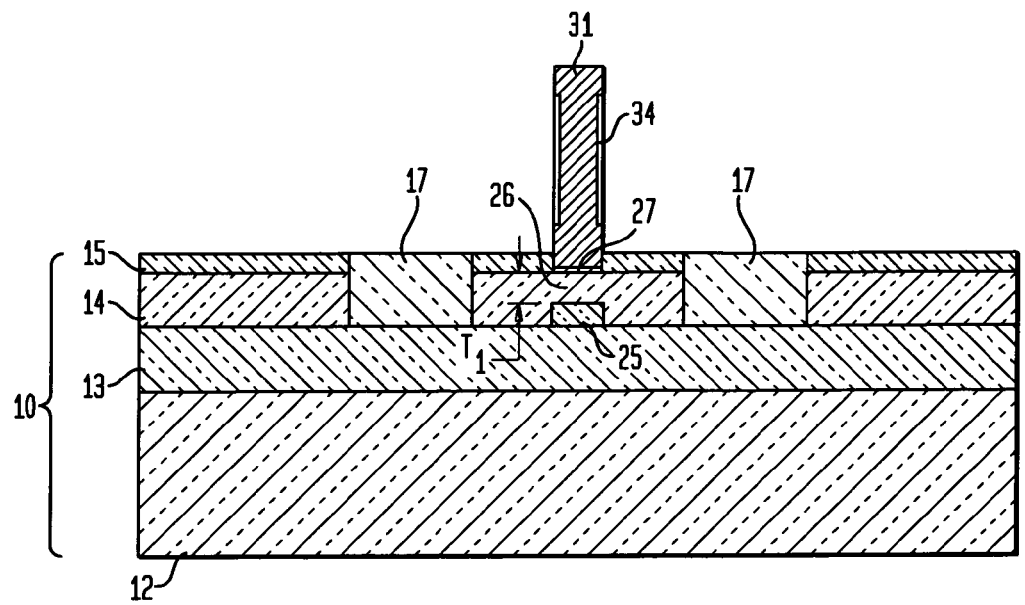
FIG. 13 is a pictorial representation (through cross sectional view) of the structure shown in FIG. 12 following etch stop layer removal.

Turning to FIG. 12, the block mask 30 is then removed using a conventional wet or dry etch process selective to the etch stop 19 and the gate region 31. The etch stop 19 protects the underlying shallow trench isolation regions 17 during removal of the block mask 30, where the block mask 30 preferably comprises a high density plasma oxide. Following patterned block mask 30 removal, a conventional anisotropic etch removes the horizontal surfaces of the etch stop layer 19, as depicted in FIG. 13.

Figure 14:
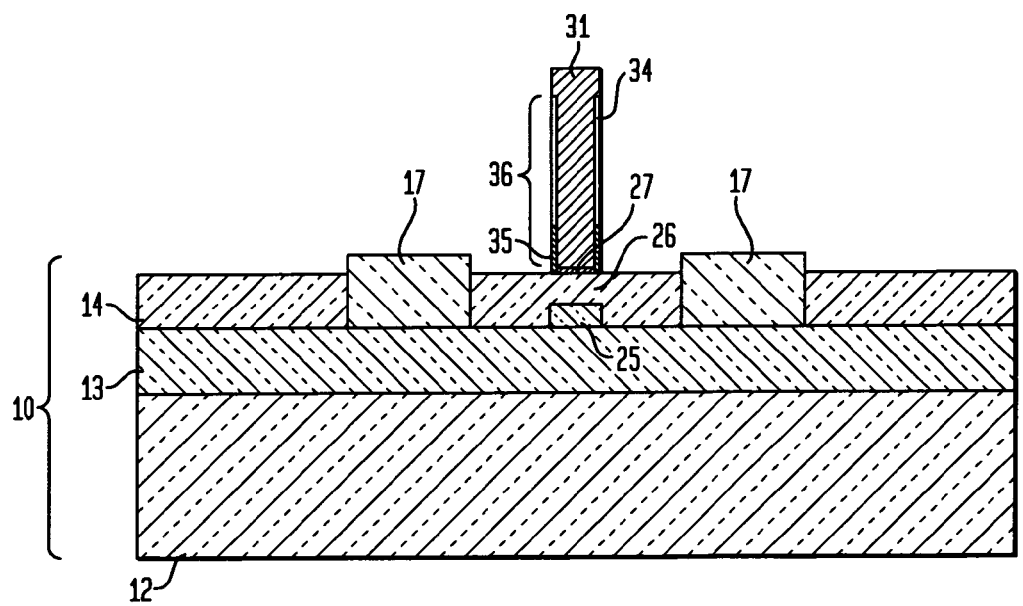
FIG. 14 is a pictorial representation (through cross sectional view) of the structure shown in FIG. 13 following spacer formation.

Referring to FIG. 14, pad oxide layer 15 is then etched selective to the underlying SOI layer 14 using an anisotropic dry etch process. During pad oxide layer 15 etch, spacers 34 protect an underlying portion of said pad oxide layer 15 to form oxide spacers 35. A composite spacer 36 is formed comprising spacers 34 atop oxide spacers 35 as depicted in FIG. 12.

Still referring to FIG. 14, extension regions 24 are then formed using a conventional ion implantation process. P-type extension regions are typically produced with group III-A elements and n-type extension regions are typically produced with group V elements. In the case of the p-type implants, a typical impurity species is boron or $BF_2$. Boron with an energy of about 0.2 keV to 3.0 keV or $BF_2$ with an energy of about 1.0 keV to about 15.0 keV and a dose of about $5 \times 10^{13}$ atoms/cm$^2$ to about $3 \times 10^{16}$ atoms/cm$^2$ can be used to implant the p-type region. A typical implant for the n-type regions is arsenic. The n-type regions can be implanted with arsenic using an energy of about 0.5 keV to 5.0 keV with a dose of about $3 \times 10^{13}$ atoms/cm$^2$ to about $3 \times 10^{16}$ atoms/cm$^2$.

Although the present invention has been depicted using a single device for the purposes of clarity, multiple devices may be processed on a single substrate using conventional patterning techniques well known within the skill of the art. Regions of the substrate may be selectively implanted by employing layers of photoresist and then patterning the layers of photoresist through photolithography.

More specifically, a layer of photoresist is deposited atop the entire structure. The photoresist layer may be comprised of dielectrics including carbon, oxygen, and various inorganic metals. The photoresist layer is then selectively patterned and developed to form a block mask, protecting at least one first region of the substrate and exposing at least one second region of the substrate. The exposed regions of the device are then implanted while the regions underlying the block mask are protected. Following processing of the first region, the block mask is removed by conventional stripping techniques. Another block mask may be formed and utilized as described above for processing another region of the substrate. Therefore, substrates having multiple device regions are within the scope of the present invention.

Additionally, when processing multiple regions with different implant species a set of offset spacers (not shown) may be formed adjacent to the composite spacers 36, where the additional offset spacers act as an independent adjustment to compensate for dopant species having higher diffusivity. For example, boron has a higher diffusivity than arsenic. Therefore, the additional offset spacers may be incorporated into regions implanted with boron to compensate for the difference in diffusion rates between the regions implanted with boron as opposed to regions implanted with lower diffusivity dopants such as arsenic.

Following extension region implant, source-drain spacers are formed by depositing a conformal film like SiN for example and next removing the SiN from the horizontal surfaces using a highly directional dry etch process. After source-drain implantation, typically arsenic or phosphorus for nFETs and boron for pFETS, the junctions are activated by an annealing process including but not limited to rapid thermal anneal. The rapid thermal annealing temperature is carried out using a temperature of 750° C. to about 1200° C. for a time period of about 1.0 second to about 20.0 seconds.

In some embodiments, normal BEOL processing may now be performed such as standard contact and wiring processes well known within the skill of the art.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming a thin channel MOSFET comprising:
    providing a SOI substrate having an SOI layer of a first thickness located on a buried insulating layer;
    forming a block mask having a channel via atop said SOI substrate;
    providing a localized oxide region in said SOI layer and on top of, and in contact with, an upper surface of said buried insulating layer, wherein said localized oxide regions thins a portion of said SOI layer to a second thickness that is less than said first thickness, said localized oxide region is self-aligned with said channel via and does not extend entirely across said buried insulating layer;
    forming a gate in said channel via;
    removing at least said block mask; and
    forming source/drain extensions in said SOI layer abutting said thinned portion of said SOI layer.

2. The method of claim 1 wherein providing said localized oxide region further comprises:
    implanting oxygen dopant through said channel via to create a dopant profile in a portion of said SOI layer; and
    annealing said SOI substrate to convert said dopant profile into said localized oxide region.

3. The method of claim 2 wherein said SOI layer comprises a thickness ranging from about 20.0nm to about 70.0 nm.

4. The method of claim 2 wherein said SOI layer further comprises isolation regions.

5. The method of claim 2 wherein said oxygen dopant is implanted with a dopant concentration ranging from $1 \times 10^{14}$ atoms/cm$^2$ xto $2 \times 10^{18}$ atoms/cm$^2$.

6. The method of claim 2 wherein said oxygen dopant is implanted using an ion implantation apparatus having a current beam density ranging from about 5.0 mA cm$^{-2}$ to about 10.0 mA cm$^{-2}$.

7. The method of claim 2 wherein said SOI layer comprises Si, SiGe, SiGeC, SiC or combinations thereof.

8. The method of claim 2 wherein said localized oxide region thins said portion of said SOI layer to less than about 50.0 nm.

9. The method of claim 2 further comprising forming a material stack on said SOI substrate prior to forming said block mask, said material stack including a pad oxide layer positioned on said SOI layer and an etch stop layer positioned on said pad oxide layer.

10. The method of claim 9 wherein said etch stop layer comprises $Si_3N_4$.

11. The method of claim 9 wherein said forming said block mask having said channel via further comprises:
   forming a dummy gate region atop said material stack;
   forming a masking layer substantially coplanar with a top surface of said dummy gate region;
   removing said dummy gate region to produce said block mask having said channel via; and
   forming a conformal film atop said block mask and within said channel via.

12. The method of claim 11 wherein said masking layer is a high-density plasma oxide.

13. The method of claim 9 wherein said etch stop is formed by a deposition process selected from the group consisting of chemical vapor deposition, room temperature chemical vapor deposition, and plasma enhanced chemical vapor deposition and has a thickness ranging from about 50.0 nm to about 150.0 nm.

14. The method of claim 11 wherein forming said dummy gate region comprises
   depositing a layer of polysilicon atop said etch stop layer;
   applying a patterned photoresist to said layer of polysilicon; and
   etching said regions of said layer of polysilicon not underlying said patterned photoresist to form said dummy gate region.

15. The method of claim 14 wherein said etching said regions of said layer of polysilicon not underlying said pattered photoresist comprises HBr etch chemistries.

16. The method of claim 14 further comprising removing said patterned photoresist using an $O_2$ ash process.

17. The method of claim 11 wherein said removing said dummy gate region comprises etching said dummy gate regions with bromide gas etch chemistries having a high selectivity to said etch stop layer.

18. The method of claim 17 wherein said dummy gate region is removed using chemical deposition etching or KOH stopping on said etch stop layer.

19. The method of claim 11 wherein said forming said gate in said channel via comprises:
   etching horizontal surfaces of said conformal film and said material stack to expose said SOI layer;
   forming a gate dielectric atop said SOI layer;
   forming a gate conductor atop said gate dielectric and removing said block mask.

20. The method of claim 19 wherein said gate dielectric is formed by thermal oxidation.

21. The method of claim 19 wherein said forming said gate conductor comprises blanket depositing a gate conductor material atop said block mask and atop said gate dielectric and planarizing said gate conductor material until said gate conductor material is coplanar with said block mask.

22. The method of claim 19 wherein etching said material stack layer comprises:
   etching said etch stop layer selective to said pad oxide layer; and
   etching said pad oxide layer with a chemical oxide removal process comprising a vapor or plasma of HF and $NH_3$.

23. The method of claim 19 where said gate conductor material is polysilicon.

24. The method of claim 19 wherein said polysilicon is doped prior to said removing said block mask.

25. The method of claim 1 wherein forming source/drain extension regions further comprises doping said SOI layer with a group IIIA or a group V dopant.

26. The method of claim 1 wherein said source/drain extension regions have a thickness of about 20.0 nm to about 70.0 nm.

* * * * *